United States Patent [19]

Ahmann et al.

[11] 4,037,270
[45] July 19, 1977

[54] CIRCUIT PACKAGING AND COOLING

[75] Inventors: Gerald L. Ahmann, St. Paul; Douglas M. Carlson, Anoka; Warren B. Marquardt, Stillwater; Richard E. Offerdahl, Shoreview; Roger A. Paulson; Anthony A. Vacca, both of New Brighton, all of Minn.

[73] Assignee: Control Data Corporation, Minneapolis, Minn.

[21] Appl. No.: 689,215

[22] Filed: May 24, 1976

[51] Int. Cl.² .............................................. H05K 7/20
[52] U.S. Cl. ..................................... 361/385; 357/82; 174/52 FP
[58] Field of Search ................ 357/82; 361/382, 385, 361/388; 174/52 FP

[56] References Cited
U.S. PATENT DOCUMENTS 3,141,998  7/1964  Silkmann .............................. 361/414
3,846,734  11/1974  Pauza ................................. 174/52 FP Primary Examiner—Gerald P. Tolin
Attorney, Agent, or Firm—Robert M. Angus

[57] ABSTRACT

A circuit board is provided with a plurality of groups of connectors, so disposed and arranged in respect to each other that each group is capable of receiving a chip carrier. A fluid conduit, carrying a coolant, extends through each group so that when the contacts of a chip carrier are assembled to a group of connectors, a circuit chip, having a heat dissipating bar, is in close contact with the conduit. Conductors on each chip make electrical contact to the contacts on the chip carrier. A clip fastener is fastened to the carrier and includes bias means to bias the chip so that electrical connection is established between the chip contacts and the carrier contacts and thermal connection is established between the heat dissipating bar and the conduit.

11 Claims, 8 Drawing Figures

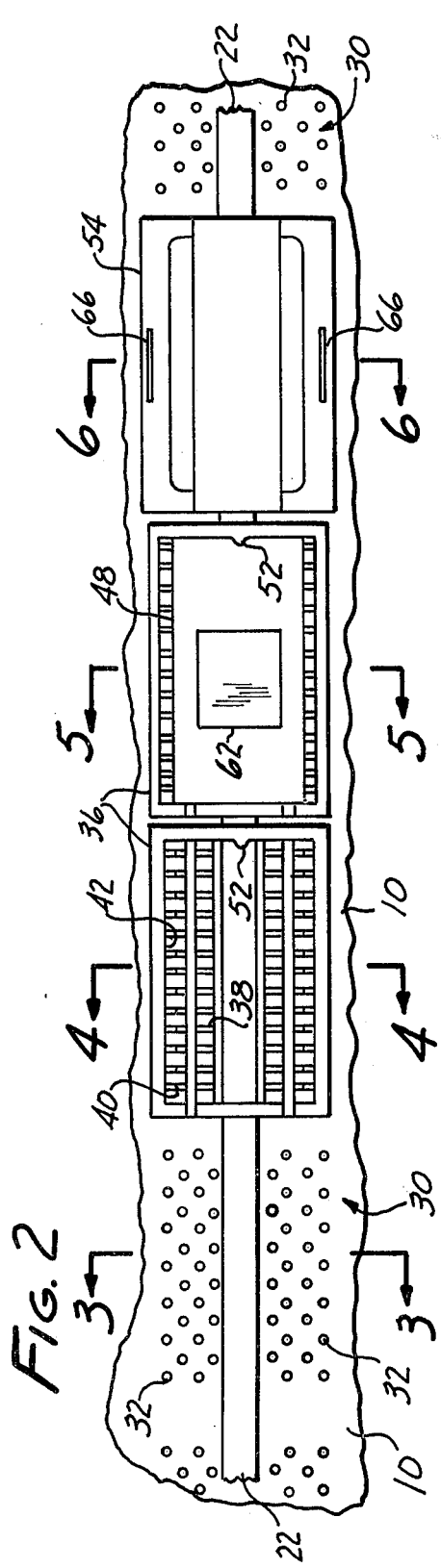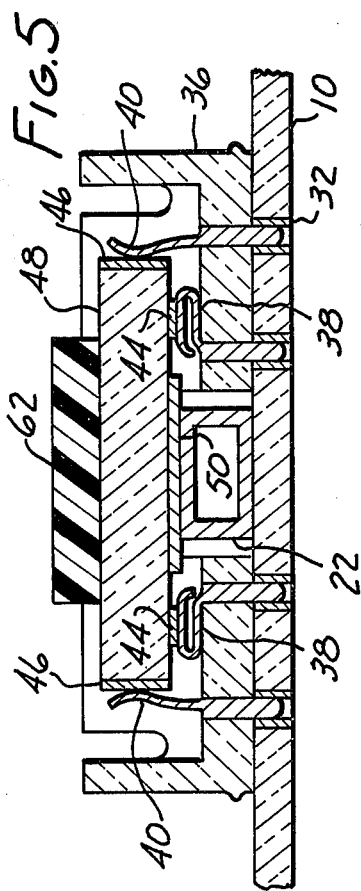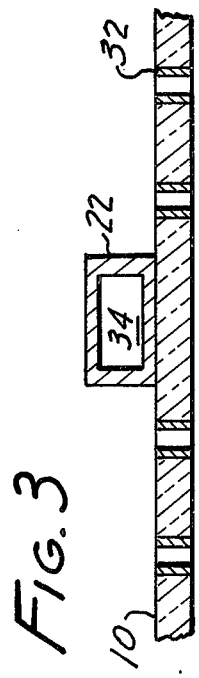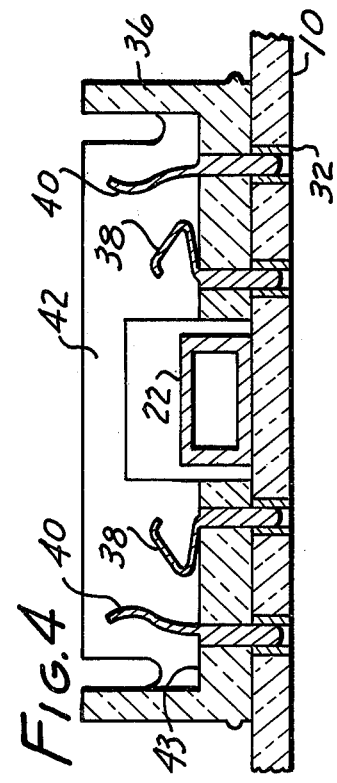

CIRCUIT PACKAGING AND COOLING

This invention relates to circuit packaging techniques, and particularly to apparatus and techniques relating to packaging circuit modules to achieve high density of electronics as well as for cooling purposes.

In recent years there has been a growing interest in circuit packaging techniques to develop large scale circuit modules confined to as small of volume as possible. With the advent of integrated circuits, thin film circuitry, and the like, it has been possible to manufacture entire circuits into individual chips. For example, a circuit chip having dimensions of about ½ × ½ × 1/16 inch may contain the equivalent circuitry of a module containing discrete components and having dimensions of about 6 × 8 × 4 inches. Thus, a significant volume reduction may be achieved through the use of integrated circuit chips in lieu of discrete circuit modules.

While integrated circuit chips offer distinct space saving advantages over the equivalent discrete-circuit modules, the close proximity of densely packaged circuits creates cooling problems not usually associated with less densely packaged modules. Particularly, although integrated circuit chips ordinarily require a significantly less amount of electrical power than the equivalent discrete circuit module, the power dissipation per unit volume is significantly higher for integrated circuit modules than for the equivalent discrete circuit module. Consequently, investigation has been devoted to developing techniques for packaging integrated circuit chips and for cooling the same.

The present invention is particularly related to a technique for packaging integrated circuits and for cooling the integrated circuits in a uniform manner.

Particularly, it is an object of the present invention to provide an assemblage of integrated circuits packaged in such a manner as to achieve a very high density of circuits, and so deposed and arranged in relationship to each other and to a cooling media as to achieve adequate cooling of each circuit chip.

It is another object of the present invention to provide an integrated circuit package, functionally equivalent to a discrete circuit module, incorporating a cooling system so as to occupy a small volume.

In accordance with the present invention, a circuit board is provided with a plurality of groups of connectors so disposed and arranged in respect to each other that each group is capable of receiving a chip carrier. A plurality of chip carriers are assembled to the circuit board in such a manner that each chip carrier is assembled to a single group of connectors. A conduit, capable of carrying a coolant, is assembled to the circuit board in the region of each group of connectors so that when a circuit chip is assembled to the chip carrier a cooling bar on the chip is contiguous to a surface of the conduit. Pad conductors on the chip are in electrical contact with the connectors assembled to the chip carrier and the circuit board. Fastener means, such as a clip fastener, is assembled to the chip carrier to bear against the chip to establish adequate electrical contact between the pads on the chip and thermal contact between the cooling bar on the chip and the conduit.

One feature of the present invention resides in the design of the chip carrier and fastener means, and their combined relationship to the cooling conduit so as to establish a high density of electrical chips on the circuit board, yet provide adequate cooling for each chip.

Another feature of the present invention resides in the provision of chip carriers having contacts to electrically mate with pads on the chips without mechanical connection (such as solder), thereby permitting ready removal and replacement of chips from the chip carriers.

The above and other features of this invention will be more fully understood from the following detailed description and the accompanying drawings, in which:

FIG. 2 is a planar view of a portion of the apparatus illustrated in FIG. 1, particularly illustrating different portions of the assemblage of the circuit board, chip carrier, chip and fastener means;

Figure 1:
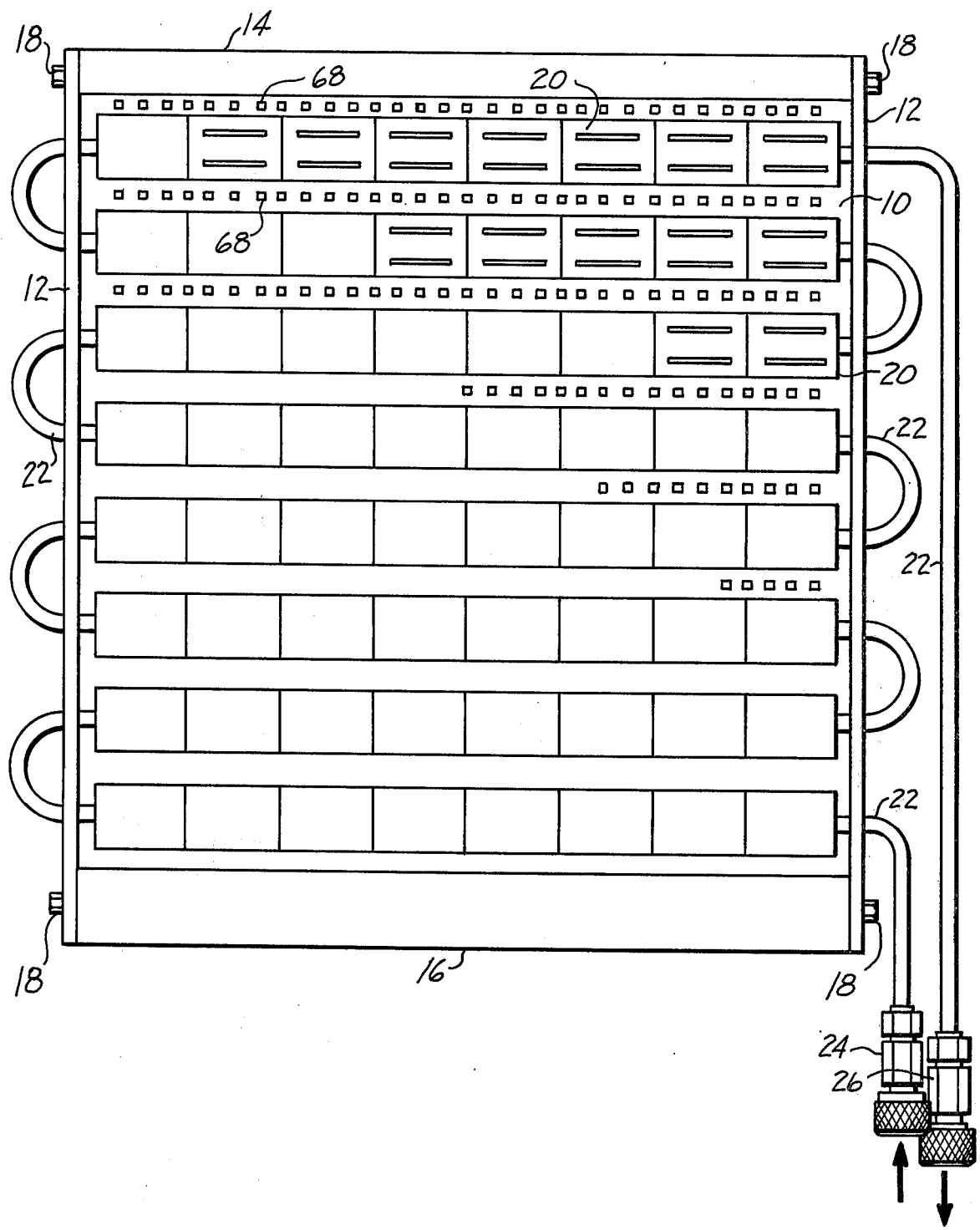
FIG. 1 is a planar view of an integrated circuit module assembly in accordance with the presently preferred embodiment of the present invention.
Figure 6:
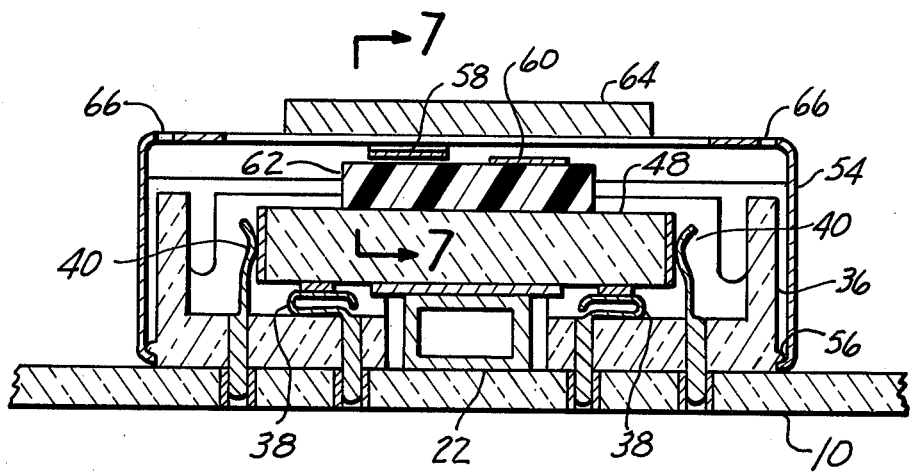
Figure 7:
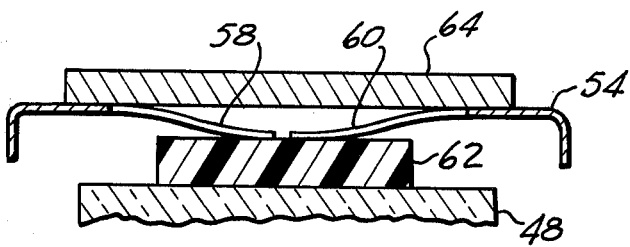
Figure 8:
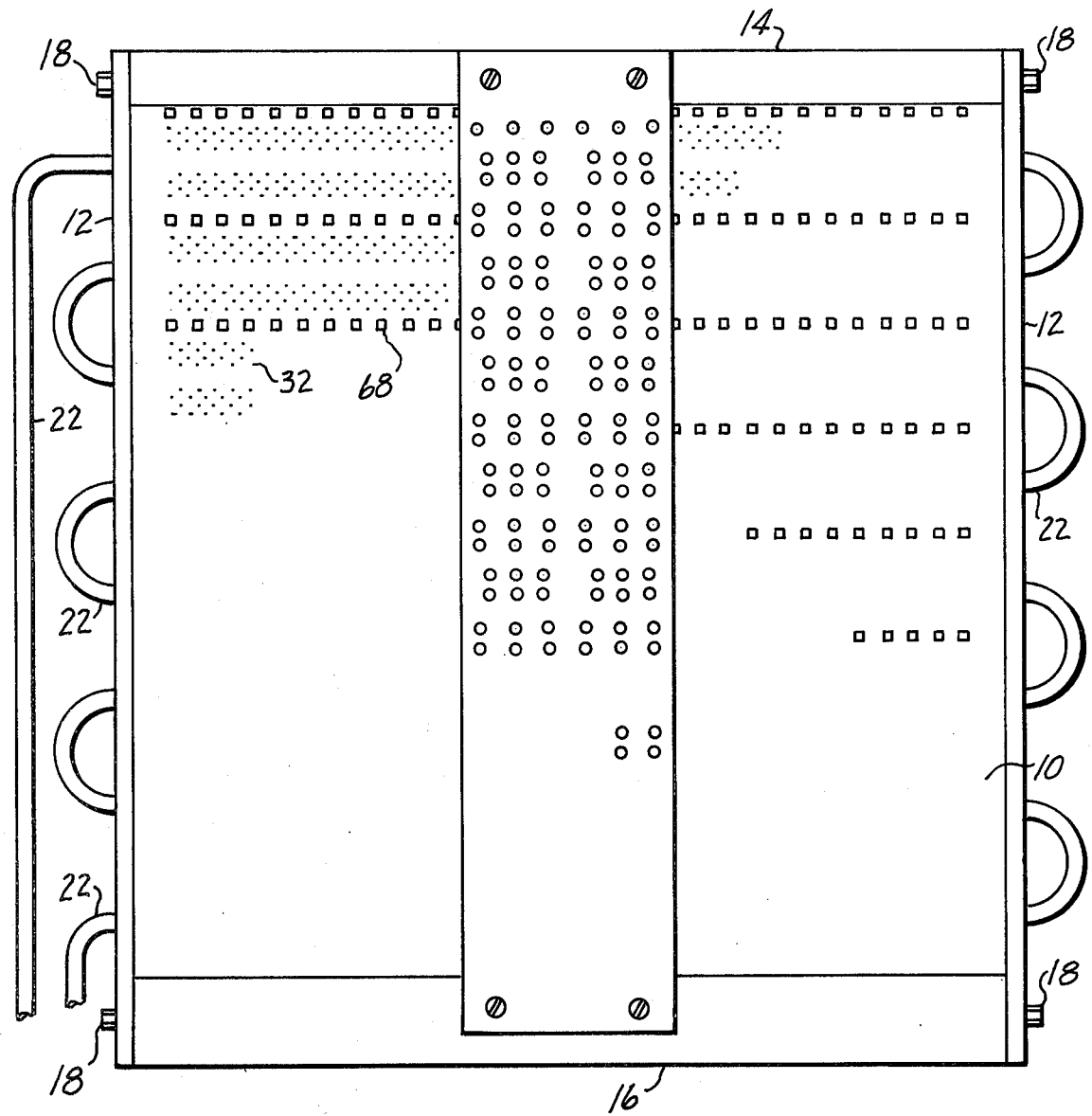

FIGS. 3, 4, 5 and 6 are section views taken at lines 3—3, 4—4, 5—5 and 6—6 respectively, in FIG. 2;

FIG. 7 is an exploded section view of a portion of the fastener means and chip taken line 7—7 in FIG. 6; and FIG. 8 is a planar view of the rear portion of the assembly illustrated in FIG. 1.

Referring to the drawings, and particularly to FIG. 1, there is illustrated a planar view of a circuit assemblage in accordance with the presently preferred embodiment of the present invention. As illustrated in FIG. 1, a circuit board 10 is nested in a frame comprising side extrusions 12 and upper and lower extrusions 14 and 16. Typically for example, circuit board 10 may be fastened directly to extrusions 12 which in turn may be fastened to extrusions 14 and 16 by suitable fasteners 18. Chip assemblages 20 are fastened to circuit board 10 (by techniques to be described in connection with FIGS. 2-7). As illustrated in FIG. 1, chip assemblages 20 are preferrably arranged in rows, but it is to be understood that the assemblage may be arranged in any desired geometrical pattern. A continuous conduit extends through a tortuous path adjacent to the upper surface of circuit board 10, through extrusions 12, in such a manner as to pass through the approximate mid-point of each row of chip assemblages 20. Fitting 24 is fastened to one end of conduit 22 and Fitting 26 is fastened to the other end. Fittings 24 and 26 are connected to suitable refrigeration means (now shown) to pass a suitable refrigerant through the conduit 22. For example, such a refrigeration system may comprise a suitable compressor and heat exchange unit well known in the refrigeration art so as to pump a suitable coolant, such as Freon through the conduit 22.

With reference particularly to FIGS. 2-7, the details of the chip assemblages 20 may be explained. As illustrated particularly in FIG. 2, and particularly the left portion thereof, and in FIG. 3, circuit board 10 contains a plurality of groups 30 of connectors 32. For example, connectors 32 may comprise plated through holes plated with a suitable metal capable of receiving a pin contact. Conduit 22, which may be constructed of a suitable thermally conductive metal, included a passage 34 through which coolant flows. Conduit 22 is assembled to the upper surface of board 10 and is supported thereby to bisect each group 30 of connectors 32. Chip carrier 36, which may be constructed of a suitable nonconductive material such as plastic, includes a lower wall having pin contacts 38 and 40 supported therein. (FIG. 4) The pin portions of pin contacts 38 and 40 are received in individual ones of connectors 32 in circuit board 10. Carrier 36 forms a cavity 42 having a lower surface 43 below the upper surface of conduit 22. Pin contacts 38 and 40 are each designed with a spring loaded contact head adapted to contact a pad 44 and 46 on chip 48 (FIG. 5). Also, a heat dissipating bar 50 on the chip is positioned contiguous to the upper surface of conduit 22.

As illustrated particularly in FIG. 2, a suitable detent 52 is provided on chip carrier 36 and on chip 48 to provide proper alignment of the chip to the chip carrier.

With reference to FIG. 6, fastener clip 54 is fastened over chip carrier 36. Clip 54, which may be constructed of a suitable thin resilient metal, is curved inwardly at lower extremities of the side portions thereof so as to fasten over nodules 56 on carrier 36. The upper portion of clip 54 forms a pair of suitable leaf springs 58 and 60 which bear against pad 62 of chip 48. Preferably, a suitable strengthening bar 64 is fastened to the upper surface 54 to provide added strength to the clip. Also, as illustrated particularly in FIGS. 2 and 6, slots 66 are provided near the edge of the clip so that a suitable tool may be inserted therein to separate the side arms of clip 54 from detent 56 to facilitate removal of the clip.

It will be appreciated that chip 48 is positioned within the chip carrier 36 so that the pads 44 and 46 on the chip make electrical connection to pin contacts 38 and 40. Further, heat dissipating bar 50 on the chip is held in a contiguous relationship to the conduit 22 carrying the coolant, and is held in that position by springs 58 and 60 of the clip fastener.

As shown in FIG. 8, suitable connections (not shown) may be made to the chips by hardwire or printed circuit connections on the rear of circuit board 10 between each of the connectors 32. Additionally, hardwire connection may be made by discrete connection between the connectors 32 and individual connector pads 68, illustrated between the rows of chip assemblages 20 in FIGS. 1 and 8. Further, housing 70 may be fastened to upper and lower extrusions 14 and 16 adjacent the rear of board 10 and includes contacts 72 each connected by means not shown to suitable test points of the chips 48.

One feature of the present invention resides in the fact that connectors 32 extend to the rear surface of the board 10, therby permitting direct connection of transmission line segments and power input to the chips 48. Thus, attachment of transmission lines and power lines may be made via suitable connectors (not shown) capable of mating with connectors 32. Hence, is is not necessary to route transmission lines and power lines to the edge of the circuit board, therby reducing delays associated with the longer lead path of such edge connections and reducing power dissipation from the longer conductors. Additionally, the arrangement permits use of software controlled routers to interactively route circuit interconnections as desired for a particular data processing operation.

One feature of the present invention resides in the provision of a resistive layer (not shown) laminated in board 10 to terminate all lines requiring local termination. Hence, signal lines carrying high transient signals may be terminated at the destination of the line segment. This feature provides an even distribution of termination power on a plane opposite the cooling conduits from the imbedded printed circuitry of board 10.

The present invention thus provides apparatus for assembling integrated circuits into a compact and dense circuit arrangement, yet providing cooling capabilities to the integrated circuit chips to adequately cool the apparatus. The design and technique has been proven successful, even in large scale electronic application, such as computers and communication equipment.

This invention is not to be limited by the embodiment shown in the drawings and described in the description, which is given by way of example and not of limitation but only in accordance with the scope of the appended claims.

What is claimed is:

1. A circuit assemblage comprising, in combination: a circuit board; a plurality of groups of electrical connectors supported on said circuit board; fluid conduit means supported on a surface of said board and extending through each of said groups of connectors, said conduit means being constructed of a thermally conductive material and being adapted to carry a coolant; a plurality of carrier means each supporting a plurality of electrical contacts, each of electrical contacts of each of said carrier means being assembled to respective connectors of respective groups of connectors so that each of said carrier means is juxtapositioned to the portion of said conduit means extending through the respective group of connectors; a plurality integrated circuit means, each supported by a respective one of said carrier means, said circuit means each including a plurality of electrical contacts so disposed on arranged as to establish electrical connection to individual contacts of the respective carrier means, said circuit means further including a heat dissipating bar disposed and arranged as to establish thermal contact to the respective portion of said conduit means; and fastener means fastened to each of said carrier means, said fastener means including bias means for biasing the respective circuit means so that the respective heat dissipating bar bears against the respective portion of said conduit means, and the respective contacts on said circuit means bears against respective contacts on the carrier means.

2. Apparatus according to claim 1 including a plurality of nodule means on each of said carrier means, said fastener means including resilient areas disposed and arranged to engage said nodule means to thereby fasten said fastener means to said carrier means.

3. Apparatus according to claim 2 further including slot means in said fastener means to permit insertion of a tool to separate said arms from said nodule means.

4. Apparatus according to claim 3 wherein said bias means comprises leaf spring means formed from a portion of said fastener means.

5. Apparatus according to claim 2 wherein said bias means comprises leaf spring means formed from a portion of said fastener means.

6. Apparatus according to claim 1 wherein said bias means comprises leaf spring means formed from a portion of said fastener means.

7. Apparatus according to claim 1 further including a resistive layer imbedded in said circuit board for line termination of signals carried by selected ones of said connectors.

8. Apparatus according to claim 7 further including a second plurality of groups of connectors on said circuit board, each connector of said second plurality of groups of connectors being electrically connected through said circuit board to a selected connector of said first-named plurality of groups of connectors, said second plurality of groups of connectors being exposed to the surface of said circuit board opposite the surface to which said fluid conduit means is supported, whereby electrical interconnections between said circuit means may be established by electrical convertion between selected ones of said connectors of said second plurality of groups of connectors.

9. Apparatus according to 8 further including a plurality of nodule means on each of said carrier means, said fastener means including resilient areas disposed and arranged to engage said nodule means to thereby fasten said fastener means to said carrier means.

10. Apparatus according to claim 9 further including slot means in said fastener means to permit insertion of a tool to separate said arms from said nodule means.

11. Apparatus according to claim 10 wherein said bias means comprises leaf spring means formed from a portion of said fastener means.

* * * * *